US010184652B2

(12) United States Patent
Ichikawa et al.

(10) Patent No.: US 10,184,652 B2
(45) Date of Patent: Jan. 22, 2019

(54) LIGHT SOURCE MODULE WITH RECESSED TEMPERATURE SENSOR AND FAN

(71) Applicant: Koito Manufacturing Co., Ltd., Tokyo (JP)

(72) Inventors: Tomoyuki Ichikawa, Shizuoka (JP); Toshiaki Tsuda, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 190 days.

(21) Appl. No.: 15/072,413

(22) Filed: Mar. 17, 2016

(65) Prior Publication Data

US 2016/0290620 A1 Oct. 6, 2016

(30) Foreign Application Priority Data

Mar. 31, 2015 (JP) .................................. 2015-072285

(51) Int. Cl.
*F21V 29/61* (2015.01)
*F21V 29/60* (2015.01)
(Continued)

(52) U.S. Cl.
CPC ............ *F21V 29/60* (2015.01); *F21V 29/503* (2015.01); *H01S 5/02407* (2013.01); *F21Y 2115/30* (2016.08); *H01S 5/02212* (2013.01)

(58) Field of Classification Search
CPC ........ F21V 29/60; F21V 29/61; F21V 29/671; H05K 7/0203; H05K 7/20136; H05K 7/20209
See application file for complete search history.

(56) References Cited

U.S. PATENT DOCUMENTS 7,252,385 B2 * 8/2007 Engle ..................... G03B 21/16
353/52
7,599,060 B2 * 10/2009 Hoshizaki ............ G01N 21/645
250/458.1
(Continued)

FOREIGN PATENT DOCUMENTS

CN 102084180 A 6/2011
CN 102878514 A 1/2013
(Continued)

OTHER PUBLICATIONS

English translation of First Office Action dated Jan. 10, 2018, issued from the Chinese State Intellectual Property Office of the P.R.C (SIPO) of Chinese Patent Application No. 201610134970.X.
(Continued)

*Primary Examiner* — Ismael Negron
(74) *Attorney, Agent, or Firm* — Abelman, Frayne & Schwab (57) ABSTRACT

A light source module includes a light source with a light emitting device and a terminal electrically connected to the light emitting device; a wiring board to electrically connect another end side of the terminal to an external power supply terminal; a thermal diffusion member between the light source and the wiring board; and a temperature detector mounted on the wiring board to detect a temperature of the light source. The thermal diffusion member has a recessed portion facing the wiring board, the temperature detector is accommodated in the recessed portion.

12 Claims, 3 Drawing Sheets

(51) Int. Cl.
*F21V 29/503* (2015.01)
*H01S 5/024* (2006.01)
*F21Y 115/30* (2016.01)
*H01S 5/022* (2006.01)

(56) References Cited

U.S. PATENT DOCUMENTS

| | | | | |
|---|---|---|---|---|
| 7,868,525 B2* | 1/2011 | Liu | ............. | F21V 29/02 |
| | | | | 313/25 |
| 8,070,324 B2* | 12/2011 | Kornitz | ............. | F21V 29/02 |
| | | | | 361/679.47 |
| 8,444,299 B2* | 5/2013 | Chou | ............. | F21V 29/004 |
| | | | | 165/80.3 |
| 2007/0105212 A1* | 5/2007 | Oldham | ............. | F21K 9/00 |
| | | | | 435/288.7 |
| 2009/0160344 A1* | 6/2009 | Hsu | ............. | F21K 9/00 |
| | | | | 315/117 |
| 2011/0049749 A1* | 3/2011 | Bailey | ............. | F21V 3/00 |
| | | | | 264/167 |
| 2011/0073159 A1* | 3/2011 | Shen | ............. | F21V 29/02 |
| | | | | 136/246 |
| 2012/0033419 A1* | 2/2012 | Kim | ............. | F21S 8/026 |
| | | | | 362/235 |
| 2012/0299801 A1* | 11/2012 | Kitano | ............. | F21V 5/007 |
| | | | | 345/32 |
| 2016/0057944 A1* | 3/2016 | Smits | ............. | A01G 9/26 |
| | | | | 362/373 |
| 2016/0174322 A1* | 6/2016 | Abele | ............. | H05B 33/0854 |
| | | | | 315/114 |

FOREIGN PATENT DOCUMENTS

| | | |
|---|---|---|
| CN | 104360572 A | 2/2015 |
| JP | 2006-278361 A | 10/2006 |

OTHER PUBLICATIONS

English translation of Second Office Action dated May 3, 2018, issued from the Chinese State Intellectual Property Office of the P.R.C (SIPO) of Chinese Patent Application No. 201610134970.X.

* cited by examiner

LIGHT SOURCE MODULE WITH RECESSED TEMPERATURE SENSOR AND FAN

CROSS-REFERENCE TO RELATED APPLICATIONS

This application is based on and claims priority from Japanese Patent Application No. 2015-072285, filed on Mar. 31, 2015, with the Japan Patent Office, the disclosure of which is incorporated herein in its entirety by reference.

TECHNICAL FIELD

The disclosure relates to a light source module, and particularly to a light source module used for a lamp of a vehicle such as an automobile.

BACKGROUND

Conventionally, there has been known a light source module having a structure, in which a laser light source includes a laser device and a metallic stem equipped with the laser device and is mounted on a circuit board (see, e.g., Japanese Patent Laid-Open Publication No 2006-278361).

SUMMARY

An aspect of the present disclosure is a light source module. The light source module includes: a light source including a light emitting device and a terminal of which one end side is electrically connected to the light emitting device; a wiring board configured to electrically connect another end side of the terminal to an external power supply terminal; a thermal diffusion member disposed between the light source and the wiring board and connected to the light emitting device in a heat-transferable manner; and a temperature detector mounted on the wiring board to detect a temperature of the light source. The thermal diffusion member has a recessed portion on a surface of the thermal diffusion member which faces the wiring board side, and the temperature detector is accommodated in the recessed portion. According to this aspect, the temperature detection accuracy of the light source may be improved.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, in the above described light source module, a so-called temperature derating control for adjusting the current supplied to a light source depending on the temperature of the light source may be performed in order to protect the light source from damage due to heat, since the light output of the light source may be excessive even at a low temperature. In order to perform the temperature derating control with high precision, it is necessary to detect the temperature of the light source with high precision.

The present disclosure has been made in view of the foregoing circumstances, and an object thereof is to provide a technology of improving a temperature detection accuracy of the light source.

In order to solve the above described problem, according to an aspect of the present disclosure, a light source module includes: a light source including a light emitting device and a terminal of which one end side is electrically connected to the light emitting device; a wiring board configured to electrically connect another end side of the terminal to an external power supply terminal; a thermal diffusion member disposed between the light source and the wiring board and connected to the light emitting device in a heat-transferable manner; and a temperature detector mounted on the wiring board to detect a temperature of the light source. The thermal diffusion member has a recessed portion on a surface of the thermal diffusion member which faces the wiring board side, and the temperature detector is accommodated in the recessed portion. According to this aspect, the temperature detection accuracy of the light source may be improved.

In the above-described aspect, the light source module may further include an insulating thermal conductive member interposed between the temperature detector and a surface of the recessed portion . According to this aspect, the temperature detection accuracy of the light source may be further improved. In the above-described aspect, the light source module may further include a fan configured to blow air into the thermal diffusion member, in which the recessed portion may be located on a leeward side in an air blowing direction of the fan, rather than at the light source side. According to this aspect, the temperature detection accuracy of the light source may be further improved. In the above-described aspect, the light source module may further include a fan configured to blow air into the thermal diffusion member. The recessed portion is arranged at the light source side, rather than a second straight line side. The second straight line is perpendicular to a first straight line and passes through a second point on the light source which is closest the fan, in which the first straight line passes through a first point on the fan which is closest to the light source and the second point. According to this aspect, the temperature detection accuracy of the light source may be further improved.

The present disclosure may provide a technology of improving a temperature detection accuracy of the light source.

Hereinafter, the present disclosure will be described with reference to the accompanying drawings based on preferred exemplary embodiments. The same or equivalent components, members, and processes illustrated in respective drawings will be denoted by the same reference numerals, and duplicative descriptions thereof will be appropriately omitted. The exemplary embodiments are not intended to limit the disclosure but illustrative. All of features and combinations thereof described in the exemplary embodiments are not necessarily essential ones of the disclosure.

(First Exemplary Embodiment)

Figure 1:
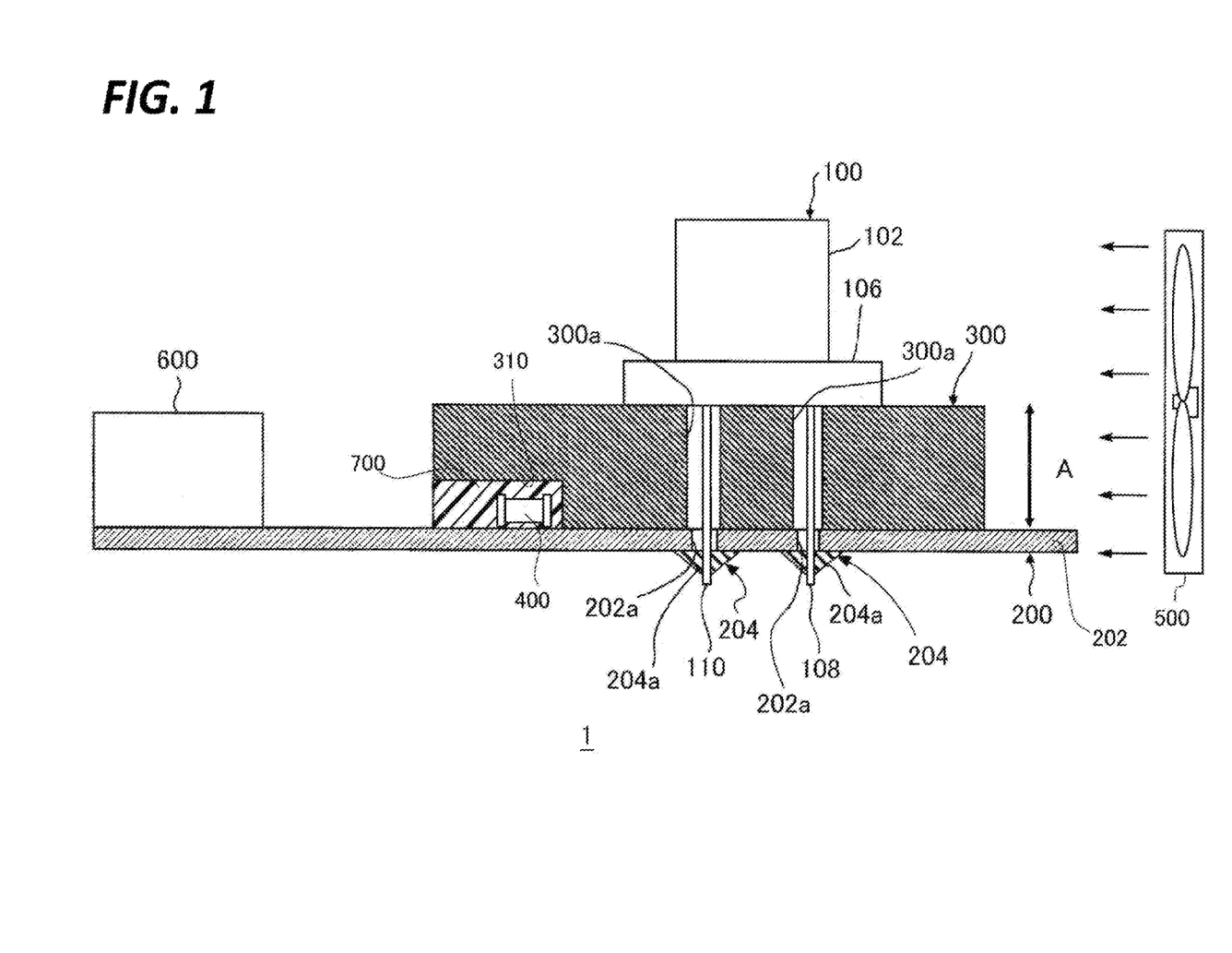
FIG. 1 is a sectional view illustrating a schematic structure of a light source module according to a first exemplary embodiment.
Figure 2:
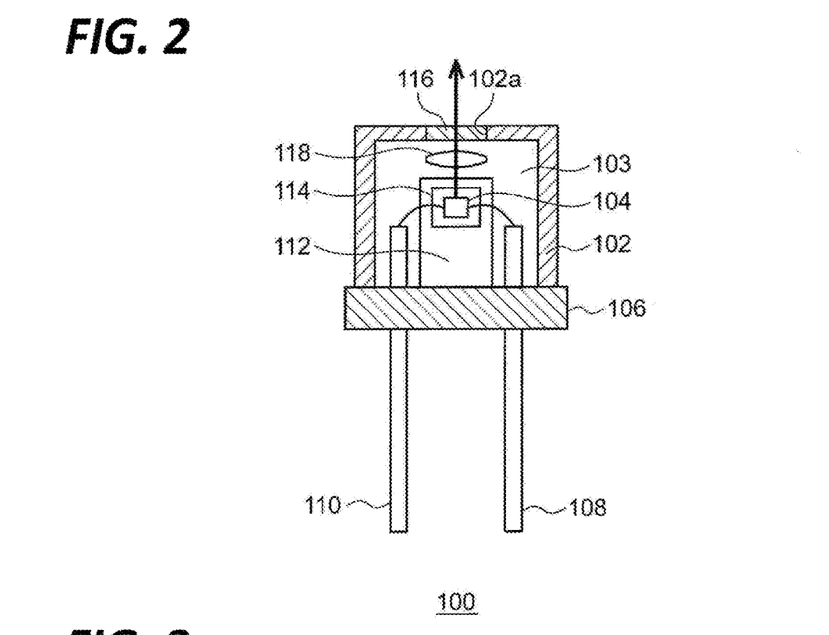
FIG. 2 is a sectional view illustrating a schematic structure of a light source.

FIG. 1 is a sectional view illustrating a schematic structure of a light source module according to a first exemplary embodiment. In FIG. 1, illustration of the internal structures of a light source 100 and an external power supply terminal 600 is omitted. Also, illustration of a wiring pattern is omitted. FIG. 2 is a sectional view illustrating a schematic structure of a light source. A light source module 1 according to the present exemplary embodiment is used for, for example, a vehicular lamp. As illustrated in FIG. 1, the light source module 1 includes the light source 100, a wiring board 200, a thermal diffusion member 300, a temperature detector 400, and a fan 500.

As illustrated in FIGS. 1 and 2, the light source 100 includes, as a main configuration, a cap 102, a light emitting device 104, a stem 106, and at least two terminals 108 and 110. The light source 100 is, for example, a conventionally known CAN package. That is, the light source 100 has a structure in which the terminals 108 and 110 extend from a space accommodating the light emitting device 104 to the outside through the stem 106. Accordingly, the terminals 108 and 110 protrude from the main surface of the stem 106, which serves as a main heat dissipation surface of the light source 100. The light source 100 produces white light by exciting a phosphor by laser.

Specifically, the light source 100 includes an internal space 103 formed by the cap 102 and the stem 106. The light emitting device 104 is accommodated in the internal space 103. The internal space 103 is hermetically sealed. The light emitting device 104 is a conventionally known laser device, and the wavelength region of the laser beam is in the range of, for example, 380 nm to 470 nm. The stem 106 is a metallic platy member, and supports the light emitting device 104. Specifically, a heat dissipation block 112 is fixed to the surface of the stem 106 which is in contact with the internal space 103. A sub-mount 114 is fixed to the heat dissipation block 112, and the light emitting device 104 is attached to the sub-mount 114. Accordingly, the stem 106 supports the light emitting device 104 through the heat dissipation block 112 and the sub-mount 114.

One electrode of the light emitting device 104 is electrically connected to one end side of one terminal 108. The other electrode of the light emitting device 104 is electrically connected to one end side of the other terminal 110. The terminals 108 and 110 are fixed to the stem 106 while being electrically insulated from the stem 106. A window 102a is provided on the top surface of the cap 102 to extract the light of the light emitting device 104 to the outside. A wavelength converter 116 is provided in the window 102a to convert the wavelength of at least a part of the light emitted from the light emitting device 104. As the wavelength converter 116, for example, a member formed by dispersing a powder phosphor in a transparent resin or glass, or a ceramic obtained by sintering the powder phosphor may be exemplified. A lens 118 is provided on an optical path of light emitted from the light emitting device 104, between the light emitting device 104 and the wavelength converter 116. The lens 118 is, for example, a collimator lens which converts light emitted from the light emitting device 104 into parallel light.

The wiring board 200 is a member configured to electrically connect the terminals 108 and 110 of the light source 100 to the external power supply terminal 600. The wiring board 200 is, for example, a conventionally known printed circuit board. The wiring board 200 includes a resinous substrate 202 such as, for example, a glass epoxy substrate and a conductive wiring pattern (not illustrated) formed on the surface of the substrate 202. The substrate 202 has through holes 202a in an area where the light source 100 is mounted. The other end sides of the terminals 108 and 110 are inserted through the through holes 202a. The other end sides of the terminals 108 and 110, and one end sides of the wiring pattern are fixed by connecting members 204a such as, for example, solder, to be electrically connected to each other. Accordingly, connection portions 204 of the wiring board 200 and the terminals 108 and 110 are formed.

The external power supply terminal 600 is provided in a predetermined area of the substrate 202 (e.g., in a peripheral edge of the substrate 202). The arrangement direction of the connection portions 204 and the external power supply terminal 600, that is, the extension direction of the wiring board 200, is a direction intersecting with the stacking direction of the light source 100, the thermal diffusion member 300, and the wiring board 200. In the present exemplary embodiment, the external power supply terminal 600 has a connector shape. An external power supply is connected to the external power supply terminal 600. The other end side of the wiring pattern is electrically connected to the external power supply terminal 600. Accordingly, when the external power supply is connected to the external power supply terminal 600, power is supplied to the light emitting device 104 through the external power supply terminal 600, the wiring pattern, the connection portions 204, and the terminals 108 and 110. A control circuit (not illustrated) configured to control the output of the light emitting device 104, or the temperature detector 400 is mounted on the wiring board 200.

The temperature detector 400 detects the temperature of the light source 100. The temperature detector 400 may be composed of a conventionally known temperature sensor such as, for example, a thermistor, a semiconductor temperature sensor, or a platinum temperature sensor. In the present exemplary embodiment, the temperature detector 400 is composed of a thermistor of a surface mount device (SMD).

The thermal diffusion member 300 is formed of a material having a high thermal conductivity such as, for example, a metal. As a metal used for the thermal diffusion member 300, for example, aluminum may be exemplified. At least a portion of the thermal diffusion member 300 is disposed between the stem 106 of the light source 100 and the wiring board 200. The thermal diffusion member 300 is thermally connected to the light emitting device 104, that is, in a heat-transferable manner That is, the thermal diffusion member 300 is clamped by the wiring board 200 and the stem 106. The thermal diffusion member 300 is fixed to the wiring board 200 by fasteners (not illustrated) such as, for example, screws. The thermal diffusion member 300 has through holes 300a at positions corresponding to the through holes 202a of the substrate 202. The terminals 108 and 110 are inserted through the through holes 300a and the through holes 202a so that the distal portions of the terminals 108 and 110 are electrically connected to the wiring pattern at the connection portions 204. The thermal diffusion member 300 has a recessed portion 310 on its surface facing the wiring board 200 side. The recessed portion 310 of the present exemplary embodiment, as illustrated in FIG. 1, extends to a side surface interconnecting a surface facing the wiring board 200 side, and a surface facing the light source 100 side. That is, the recessed portion 310 is formed by cutting a corner portion out of the thermal diffusion member 300, and is communicated with the outside of the thermal diffusion member 300 at the side surface. Thus, a thermal conductive member 700 to be described later may be easily filled within the recessed portion 310. However, the shape of the recessed portion 310 is not particularly limited, and the side surface of the recessed portion 310 does not need to be in contact with the outside. That is, the recessed portion 310 may be a closed space surrounded by the thermal diffusion member 300 and the wiring board 200.

The heat generated by the light emitting device 104 may be diffused by the thermal diffusion member 300. The heat generated by the light emitting device 104 is transferred to the thermal diffusion member 300 through the sub-mount 114, the heat dissipation block 112, and the stem 106. The thermal diffusion member 300 is in surface-contact with the main surface of the stem 106. Therefore, as compared to a case where the thermal diffusion member 300 is in contact with only the side surface of the stem 106, the contact area between the stem 106 and the thermal diffusion member 300 may be increased. Accordingly, the heat dissipation of the light source 100 may be increased. The thermal diffusion member 300 includes a heat sink (not illustrated). The heat transferred to the thermal diffusion member 300 is dissipated from mainly from the heat sink portion.

The fan 500 blows air mainly into the thermal diffusion member 300. By the air blown from the fan 500, the thermal diffusion member 300, especially, the heat sink portion of the thermal diffusion member 300, is cooled. This may further increase the heat dissipation of the thermal diffusion member 300, and may further increase the heat dissipation of the light source 100. The light source 100 may be cooled by the air blown from the fan 500 as well as the heat dissipation to the thermal diffusion member 300.

The temperature detector 400 is accommodated in the recessed portion 310 while being mounted on the wiring board 200. When the temperature detector 400 is accommodated in the recessed portion 310, the temperature detector 400 may be suppressed from being affected by the environment in which the light source module 1 is provided so that the temperature detection accuracy of the light source 100 by the temperature detector 400 may not be lowered. As the environmental influence on the temperature detector 400, for example, air blowing of the fan 500 may be considered. For example, when the temperature detector 400 is cooled by the air blown into the temperature detector 400 from the fan 500, the temperature detector 400 may be more cooled than the light source 100. Otherwise, the temperature detector 400 may be cooled independently from or prior to cooling of the light source 100. Whereas, when the temperature detector 400 is accommodated in the recessed portion 310, it is possible to suppress the wind from the fan 500 from directly hitting the temperature detector 400. Thus, the temperature detection accuracy of the light source 100 by the temperature detector 400 may be improved.

The light source module 1 of the present exemplary embodiment further includes an insulating thermal conductive member 700 interposed between the temperature detector 400 and the surface of the recessed portion 310. That is, the temperature detector 400 and the thermal diffusion member 300 are thermally connected via the thermal conductive member 700. Accordingly, the heat of the light source 100 may be transferred to the temperature detector 400 through the thermal diffusion member 300 and the thermal conductive member 700. As the thermal conductive member 700, filler having an insulating property and a high thermal conductivity such as, for example, a silicon grease, may be used. The thermal conductive member 700 may be a gel-type member, or another type of member such as, for example, a sheet-type member.

When the temperature detector 400 is directly abutted on the thermal diffusion member 300, a short circuit may occur between them. Thus, it is preferred that the temperature detector 400 is spaced from the surface of the recessed portion 310. However, when a space is present between the temperature detector 400 and the surface of the recessed portion 310, heat conduction from the thermal diffusion member 300 to the temperature detector 400 is inhibited. Whereas, when the insulating thermal conductive member 700 is interposed between the temperature detector 400 and the surface of the recessed portion 310, a short circuit may be avoided between the temperature detector 400 and the thermal diffusion member 300, and the heat conduction from the thermal diffusion member 300 to the temperature detector 400 may be facilitated. Accordingly, the temperature detection accuracy of the light source 100 by the temperature detector 400 may be further increased.

Figure 3:
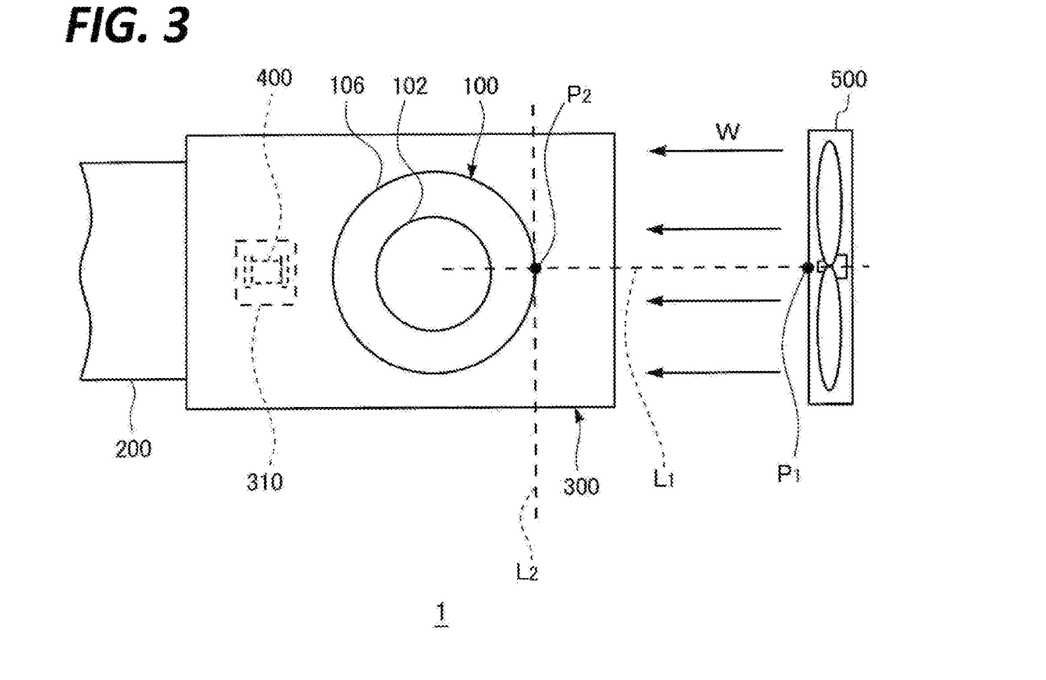
FIG. 3 is a schematic view for explaining a positional relationship among a light source, a recessed portion, and a fan in the light source module according to the first exemplary embodiment.

In the light source module 1 according to the present exemplary embodiment, the location of the recessed portion 310 is determined with respect to the light source 100 in order to further improve the detection accuracy of the temperature detector 400. FIG. 3 is a schematic view for explaining a positional relationship among the light source 100, the recessed portion 310, and the fan 500. FIG. 3 illustrates a state when viewed in a direction parallel to the stacking direction of the light source 100, the thermal diffusion member 300, and the wiring board 200.

As illustrated in FIG. 3, the recessed portion 310 is located on the leeward in the air blowing direction W of the fan 500 (the direction indicated by arrows W in FIG. 3), rather than at the light source 100 side. Thus, the temperature detector 400 may be suppressed from being more cooled than the light source 100, or cooled independently from or prior to cooling of the light source 100. Thus, the temperature detection accuracy of the light source 100 by the temperature detector 400 may be further improved.

Otherwise, the recessed portion 310 is arranged at the light source 100 side, rather than a second straight line $L_2$ side. The second straight line $L_2$ is a straight line perpendicular to a first straight line $L_1$ and passes through a second point $P_2$. The first straight line $L_1$ passes through a first point $P_1$ on the fan 500 closest to the light source 100, and the second point $P_2$ on the light source 100 closest to the fan 500. The first point $P_1$ may be assumed to be a point on the fan 500 closest to the second point $P_2$. Otherwise, the recessed portion 310 is arranged such that the light source 100 is present between the fan 500 and the recessed portion 310. This arrangement may also suppress the temperature detector 400 from being more cooled than the light source 100, or cooled independently from or prior to cooling of the light source 100. Thus, the temperature detection accuracy by the temperature detector 400 may be further improved.

As described above, the light source module 1 according to the present exemplary embodiment includes the thermal diffusion member 300 which is disposed between the stem 106 and the wiring board 200, and is connected to the light emitting device 104 in a heat-transferable manner Therefore, as compared to the case where the thermal diffusion member 300 is in contact with the side surface of the stem 106, the contact area between the stem 106 and the thermal diffusion member 300 may be increased. As a result, the heat dissipation of the light source 100 may be improved. The thermal diffusion member 300 has the recessed portion 310 on its surface facing the wiring board 200 side, and the temperature detector 400 is accommodated in the recessed portion 310. Thus, it is possible to reduce the influence on the temperature detector 400 from the external environment, that is, the influence on the temperature. Accordingly, the temperature of the light source 100 may be detected with higher precision. Also, the installation flexibility of the fan 500 may be increased.

The insulating thermal conductive member 700 is filled between the temperature detector 400 and the surface of the recessed portion 310. This may further facilitate heat conduction from the thermal diffusion member 300 to the temperature detector 400. Accordingly, the temperature detection accuracy of the light source 100 by the temperature detector 400 may be further increased.

The recessed portion 310 is arranged on the leeward in the air blowing direction W of the fan 500, rather than at the light source 100 side. Otherwise, the recessed portion 310 is arranged at the light source 100 side, rather than a second straight line $L_2$ side. The second straight line $L_2$ is perpendicular to a first straight line $L_1$ and passes through a second point $P_2$. The first straight line $L_1$ interconnects a first point $P_1$ on the fan 500 closest to the light source 100, and the second point $P_2$ on the light source 100 closest to the fan 500. This arrangement may also suppress the temperature detector 400 from being more cooled than the light source 100, or cooled independently from or prior to cooling of the light source 100. Thus, the temperature detection accuracy of the light source 100 by the temperature detector 400 may be further improved.

Second Exemplary Embodiment

The light source module 1 according to a second exemplary embodiment has the same configuration as the light source module 1 according to the first exemplary embodiment except that the temperature detection accuracy of the light source 100 by the temperature detector 400 is improved through a connection structure of the temperature detector 400 to the wiring board 200. Hereinafter, descriptions will be made on the light source module 1 according to the second exemplary embodiment by focusing on a configuration different from that of the first exemplary embodiment, and descriptions on a common configuration will be omitted.

Figure 4A:
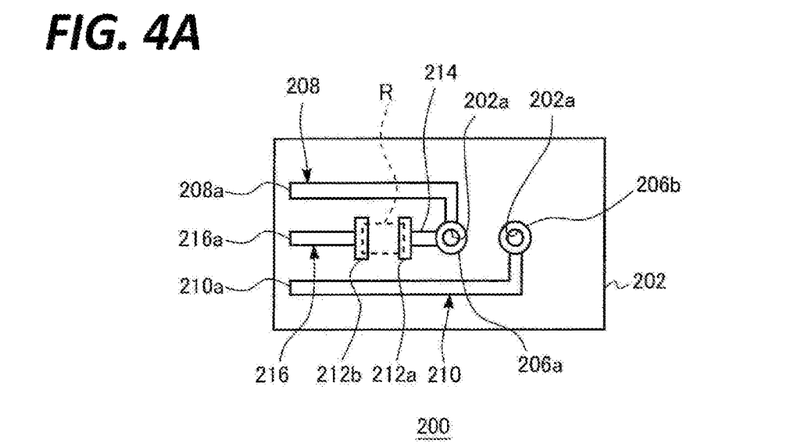
FIG. 4A is a plan view illustrating a schematic structure of a wiring board provided in a light source module according to a second exemplary embodiment.
Figure 4B:
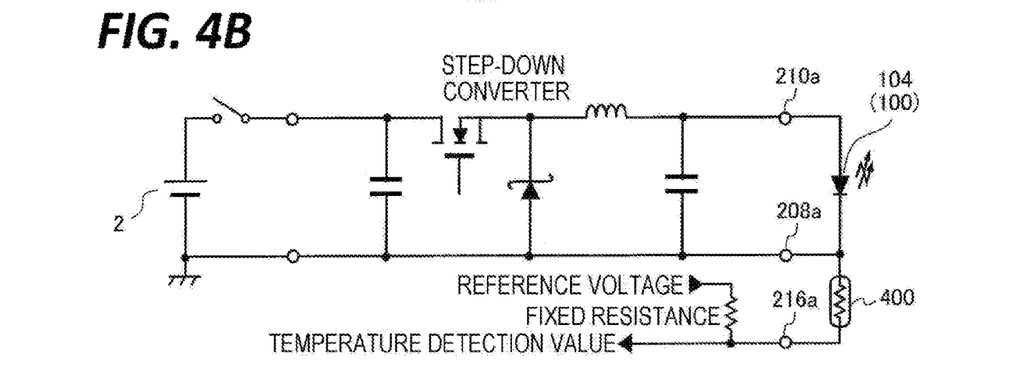
FIG. 4B is a circuit diagram illustrating a configuration of a lighting circuit of the light source module according to the second exemplary embodiment.
Figure 4C:
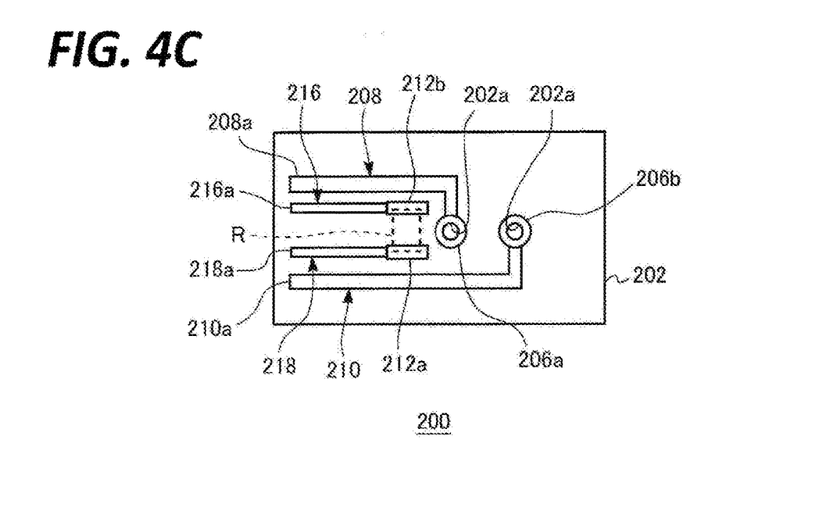
FIG. 4C is a plan view illustrating a schematic structure of a wiring board provided in the light source module according to the second exemplary embodiment.

FIG. 4A is a plan view illustrating a schematic structure of a wiring board provided in a light source module according to a second exemplary embodiment. FIG. 4B is a circuit diagram illustrating a configuration of a lighting circuit of the light source module according to the second exemplary embodiment. FIG. 4C is a plan view illustrating a schematic structure of a wiring board provided in the light source module according to the second exemplary embodiment. FIG. 4A illustrates a wiring board in a case where a cathode of the light source 100 is grounded, and FIG. 4C illustrates a wiring board in a case where a cathode of the light source 100 is not grounded. In FIGS. 4A and 4C, illustration of the external power supply terminal 600 is omitted.

As illustrated in FIGS. 4A and 4B, in the present exemplary embodiment, a cathode terminal of the light source 100 and the terminal of the temperature detector 400 are set to the same potential, and the cathode terminal and the terminal of the temperature detector 400 are electrically connected to each other. Here, for the convenience of description, the terminal 110 is assumed to be the cathode terminal. In the light source 100 including a laser device serving as the light emitting device 104, when the cathode is a die, the temperature of the cathode terminal is closest to a junction temperature. Also, an electrical conductor generally has a high thermal conductivity. Thus, the terminal 110 of the light source 100 and the terminal of the temperature detector 400 may be interconnected by the electrical conductor so as to monitor the junction temperature with high precision.

Specifically, the wiring pattern formed on the substrate 202 includes a land portion 206a electrically connected to the terminal 110 serving as a cathode terminal, and a land portion 206b electrically connected to the terminal 108 serving as an anode terminal. The land portions 206a and 206b are disposed on the peripheries of the through holes 202a. The land portions 206a and 206b may have a so-called through hole electrode structure. One end side of a wiring 208 is electrically connected to the land portion 206a. The other end side of the wiring 208 constitutes a terminal 208a. One end side of a wiring 210 is connected to the land portion 206b. The other end side of the wiring 210 constitutes a terminal 210a.

In a temperature detector mounting region R of the substrate 202, a pair of land portions 212a and 212b are provided to be electrically connected to the terminals of the temperature detector 400. One end side of a wiring 214 is electrically connected to the land portion 212a. The other end side of the wiring 214 is electrically connected to the land portion 206a. One end side of a wiring 216 is electrically connected to the land portion 212b at the other side. The other end side of the wiring 216 constitutes a terminal 216a. The terminals 208a, 210a, and 216a are electrically connected to the external power supply terminal 600 (see, e.g., FIG. 1).

Through the configuration as described above, the cathode side of the light source 100 is set to the same potential as the ground of a battery 2, that is, the ground potential. Thus, the potential of the one side terminal of the temperature detector 400 also becomes a ground potential. Thus, the temperature detector 400 may perform a temperature detection at a voltage of a ground reference. Also, since the heat of the terminal 110 close to the junction temperature may be conducted to the temperature detector 400 through the wiring 214, the temperature detection accuracy of the light source 100 by the temperature detector 400 may be improved. Also, since the terminal for connecting the light source 100 to the lighting circuit on the wiring board 200 is a three-terminal, it is possible to reduce the size and the cost of the wiring board 200 or the external power supply terminal 600.

When, for example, the light sources 100 are connected in series in multi stages, a cathode is not grounded except for the lowermost light source 100. In this case, it is difficult to electrically connect the cathode terminal of the light source 100 to the terminal of the temperature detector 400. Therefore, in such a case, the wiring pattern illustrated in FIG. 4C is employed. That is, one end side of the wiring 208 is electrically connected to the land portion 206a. The other end side of the wiring 208 constitutes the terminal 208a. One end side of the wiring 210 is connected to the land portion 206b. The other end side of the wiring 210 constitutes the terminal 210a.

Also, a temperature detector mounting region R is arranged in the vicinity of the land portion 206a. One end side of a wiring 218 is electrically connected to the land portion 212a. The other end side of the wiring 218 constitutes a terminal 218a. One end side of the wiring 216 is electrically connected to the land portion 212b. The other end side of the wiring 216 constitutes the terminal 216a. The terminals 208a, 210a, 216a, and 218a are electrically connected to the external power supply terminal 600 (see, e.g., FIG. 1).

The wiring board 200 having such a wiring pattern is mounted with the temperature detector 400 such that the temperature detector 400 is arranged in the vicinity of the cathode terminal of the light source 100. Then, the insulating thermal conductive member 700 is interposed between the mounted temperature detector 400 and the cathode terminal. For example, the temperature detector 400 is covered with the thermal conductive member 700, and a part of the thermal conductive member 700 is abutted on the terminal 110. Accordingly, the heat of the terminal 110 may be conducted to the temperature detector 400 through the thermal conductive member 700. Thus, the temperature detection accuracy of the light source 100 by the temperature detector 400 may be improved.

The temperature detector 400 may be mounted on the main surface of the wiring board 200 at the opposite side to the thermal diffusion member 300. FIG. 4A illustrates a structure where the terminal 110 and the terminal of the temperature detector 400 are electrically connected through the wiring 214, but the terminal 110 and the terminal of the temperature detector 400 may be electrically connected through a connecting member such as, for example, solder. The lighting circuit illustrated in FIG. 4B has a step-down converter, but, without particularly being limited to this configuration, a step-up converter or a step-up/down converter may be employed. In the present exemplary embodiment, an example of a case where the cathode is a die has been described. Meanwhile, when the anode is a die, the same effect may be achieved by electrically connecting the anode terminal to the temperature detector 400, or interposing the thermal conductive member 700 between the anode terminal and the temperature detector 400.

The light source module 1 according to the first exemplary embodiment may be combined with the wiring board 200 and the lighting circuit provided in the light source module 1 according to the second exemplary embodiment. In each exemplary embodiment, the light source 100 may be a laser light source other than the CAN package. The light emitting device 104 may be, for example, an LED. In each exemplary embodiment, the posture of the light source 100 with respect to the position of the external power supply terminal 600, that is, the arrangement direction of the terminals 108 and 110 is not limited to those as illustrated.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A light source module comprising:
   a light source including a light emitting device and a terminal of which one end side is electrically connected to the light emitting device;
   a wiring board configured to electrically connect another end side of the terminal to an external power supply terminal;
   a thermal diffusion member disposed between the light source and the wiring board and connected to the light emitting device in a heat-transferable manner, the thermal diffusion member having through holes through which the terminal is inserted and a recessed portion on a surface of the thermal diffusion member which faces the wiring board side; and
   a temperature detector mounted on the wiring board and accommodated in the recessed portion to detect a temperature of the light source.

2. The light source module of claim 1, further comprising:
   a fan configured to blow air into the thermal diffusion member,
   wherein a first straight line is defined by a first point on the fan closest to the light source and a second point on the light source closest to the fan, a second straight line is defined as passing through the second point and being perpendicular to the first straight line, and the recessed portion is arranged in the light source side of the second straight line.

3. The light source module of claim 1, wherein an extension direction of the wiring board intersects a stacking direction of the light source, the thermal diffusion member, and the wiring board.

4. The light source module of claim 1, wherein the recessed portion extends to a side surface interconnecting a surface facing the wiring board, and a surface facing the light source.

5. The light source module of claim 1, wherein the recessed portion defined by a corner portion removed from the thermal diffusion member, and extends to an outside of the thermal diffusion member at a side surface.

6. The light source module of claim 1, wherein the temperature detector is spaced from a surface of the recessed portion.

7. The light source module of claim 1, further comprising:
   a fan configured to blow air into the thermal diffusion member,
   wherein the recessed portion is located on a leeward side in an air blowing direction of the fan with respect to the light source.

8. The light source module of claim 7, further comprising:
   a fan configured to blow air into the thermal diffusion member,
   wherein a first straight line is defined by a first point on the fan closest to the light source and a second point on the light source closest to the fan, a second straight line is defined as passing through the second point and being perpendicular to the first straight line, and the recessed portion is arranged in the light source side of the second straight line.

9. The light source module of claim 1, further comprising:
   an insulating thermal conductive member interposed between the temperature detector and a surface of the recessed portion.

10. The light source module of claim 9, further comprising:
   a fan configured to blow air into the thermal diffusion member,
   wherein a first straight line is defined by a first point on the fan closest to the light source and a second point on the light source closest to the fan, a second straight line is defined as passing through the second point and being perpendicular to the first straight line, and the recessed portion is arranged in the light source side of the second straight line.

11. The light source module of claim 9, further comprising:
a fan configured to blow air into the thermal diffusion member,
wherein the recessed portion is located on a leeward side in an air blowing direction of the fan with respect to the light source.

12. The light source module of claim 11, further comprising:
a fan configured to blow air into the thermal diffusion member,
wherein a first straight line is defined by a first point on the fan closest to the light source and a second point on the light source closest to the fan, a second straight line is defined as passing through the second point and being perpendicular to the first straight line, and the recessed portion is arranged in the light source side of the second straight line.

\* \* \* \* \*